(12) United States Patent
Pols Sandhu et al.

(10) Patent No.: US 6,496,379 B2
(45) Date of Patent: Dec. 17, 2002

(54) PC BOARD EJECTOR ASSEMBLY AND METHOD FOR USE

(75) Inventors: Yvetta D. Pols Sandhu, Winchester, MA (US); Robert S. Antonuccio, Burlington, MA (US)

(73) Assignee: Sun Microsystems, Palo Alto, CA (US)

( * ) Notice: Subject to any disclaimer, the term of this patent is extended or adjusted under 35 U.S.C. 154(b) by 0 days.

(21) Appl. No.: 09/798,312

(22) Filed: Mar. 2, 2001

(65) Prior Publication Data

US 2002/0122303 A1 Sep. 5, 2002

(51) Int. Cl.[7] .................................................. H05K 5/00
(52) U.S. Cl. ........................ 361/754; 361/759; 361/798; 361/732; 361/726; 439/154; 439/74; 439/160
(58) Field of Search ................................ 361/754, 759, 361/798, 780, 732, 726, 727, 785, 809; 439/154.74, 160, 157

(56) References Cited

U.S. PATENT DOCUMENTS

| | | | | |
|---|---|---|---|---|
| 4,996,631 A | * | 2/1991 | Freehauf | 361/415 |
| 5,222,897 A | * | 6/1993 | Collins et al. | 439/157 |
| 5,669,512 A | * | 9/1997 | Joslin | 211/41 |
| 6,259,607 B1 | * | 7/2001 | Chien | 361/754 |

* cited by examiner

Primary Examiner—David Martin
Assistant Examiner—Hung Bui
(74) Attorney, Agent, or Firm—Cesari and McKenna, LLP; John L. Capone, Esq.

(57) ABSTRACT

A PC board ejector assembly is provided for disengaging a first PC board from a second PC board in a computer chassis. The PC boards each includes at least one connector for connecting the first PC board to the second PC board. The chassis includes a divider wall. The PC board ejector assembly includes a mounting bracket positioned on at least one of the first and the second PC boards, and a disengagement member coupled to the mounting bracket. The mounting bracket is positioned on the PC board such that movement of the disengagement member engages the member against the divider wall to disengage the PC board connectors from one another and permit removal of at least one of the PC boards. A method for disengaging a PC board including a PC board ejector assembly from a chassis is also provided. The method includes the steps of accessing a PC board including the PC board ejector assembly that is mounted in the chassis, manipulating the disengagement member of the PC board ejector assembly to disengage the PC boards from one another within the chassis, and removing that PC board from the chassis.

20 Claims, 7 Drawing Sheets

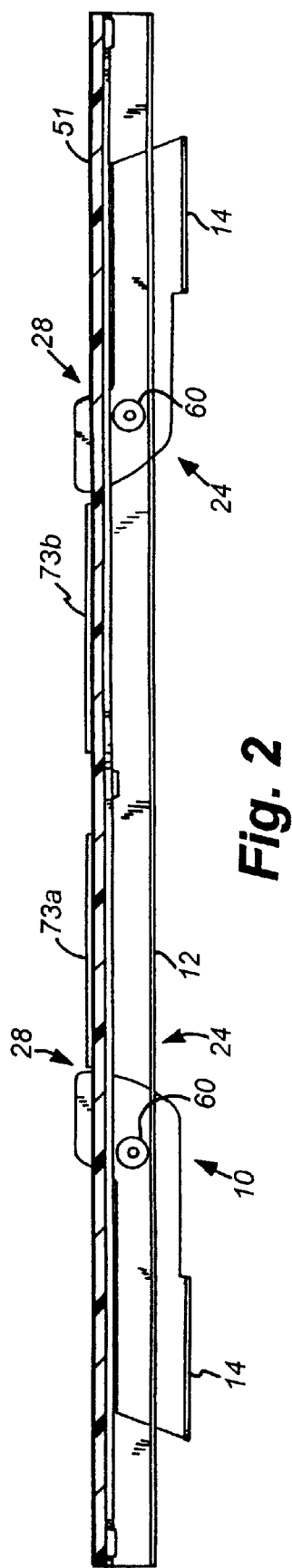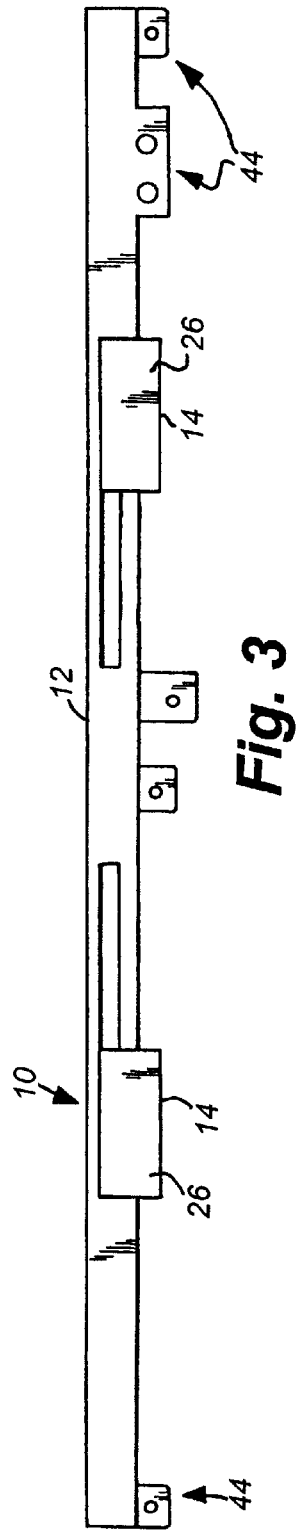

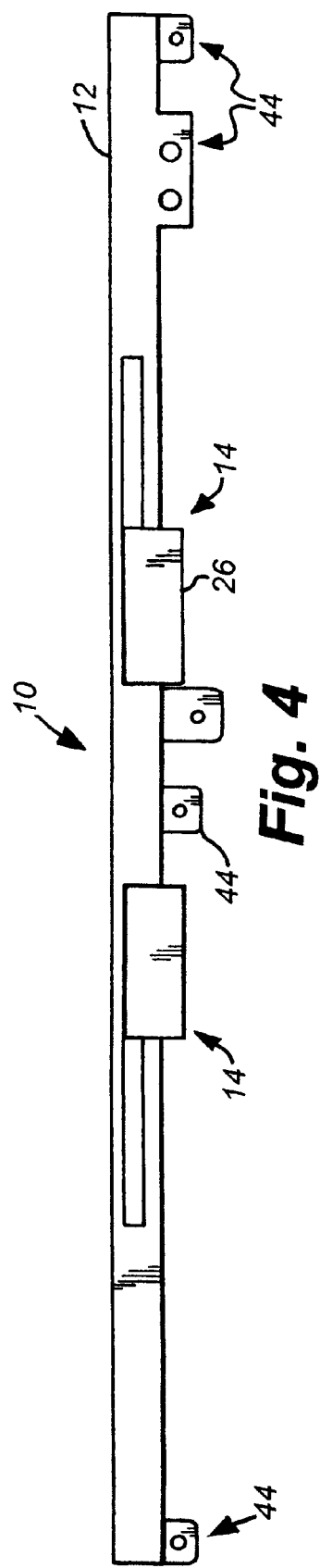

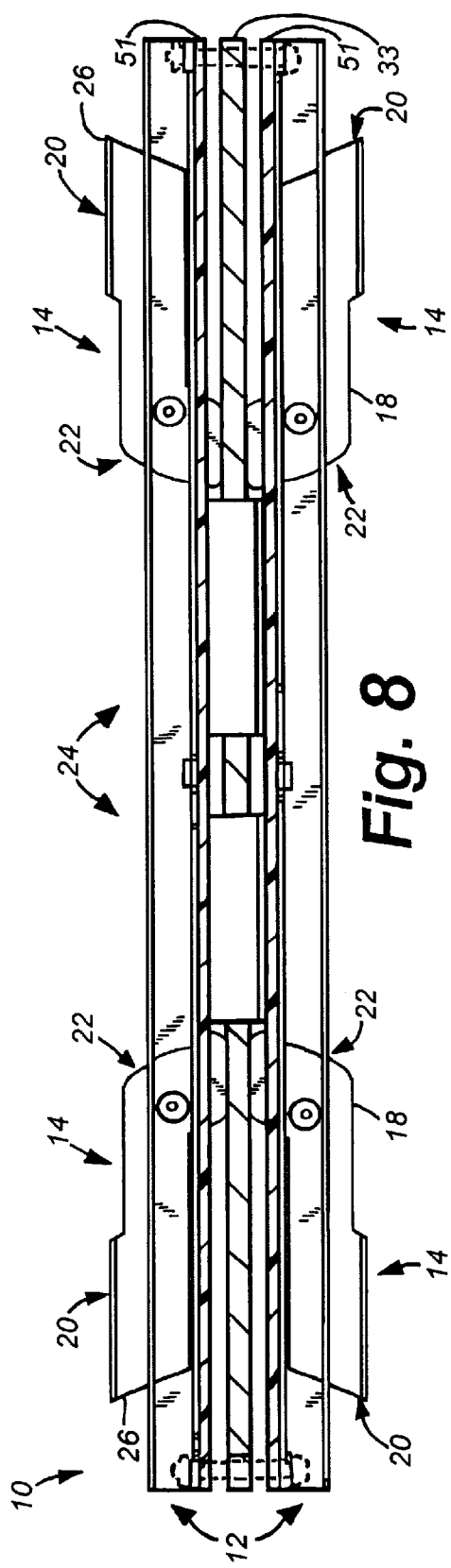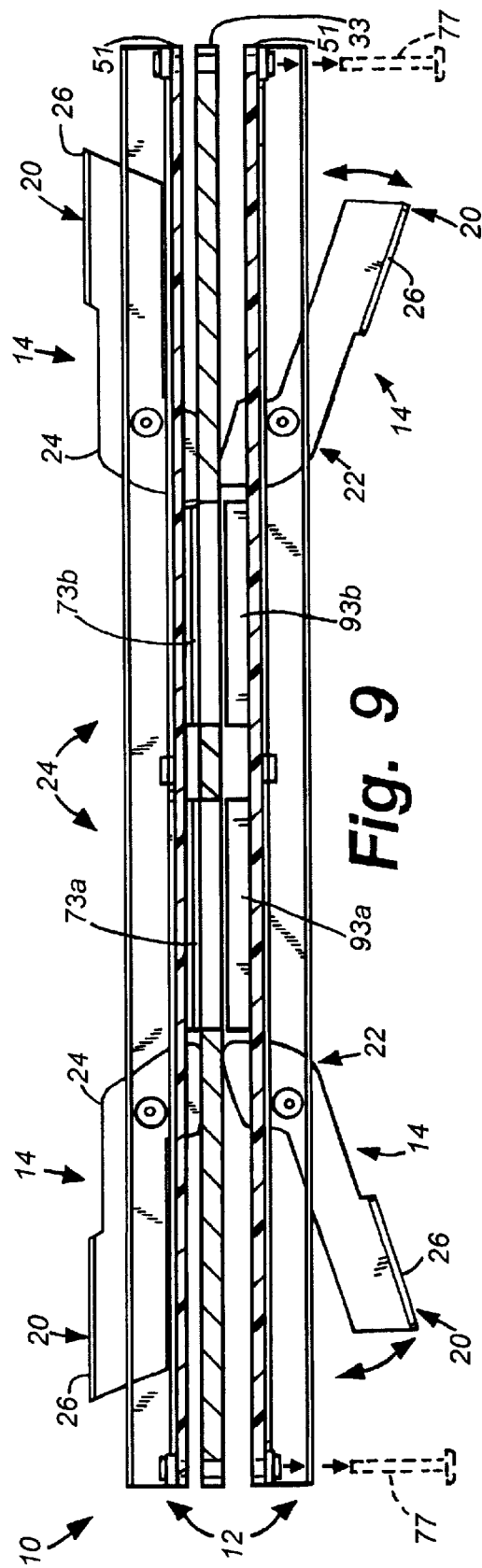

US 6,496,379 B2

PC BOARD EJECTOR ASSEMBLY AND METHOD FOR USE

FIELD OF THE INVENTION

The present invention relates to the field of computers and computer hardware. More particularly, the present invention relates to a PC board ejector assembly for removing a PC board from a computer, and to a method for using the PC board ejector assembly.

BACKGROUND INFORMATION

Computer systems typically include a central processing unit (CPU) that consists of one or more printed circuit (PC) boards, including motherboards and input/output (I/O) boards interconnected by one or more multi-pin connectors and cables. The multi-pin connectors, in turn, are configured to include of six rows of pins having forty-eight pins per row. Often times, a CPU consists of a motherboard having one or more male connectors and an I/O board having corresponding female connectors configured to be mated with the male connectors of the motherboard. The shell of the CPU typically includes a cabinet and a divider centrally disposed within the cabinet. The divider typically includes one or more cutouts and a series of bosses that extend from each side of the divider.

A CPU is typically constructed by mounting the motherboard into the center divider such that one or more male connectors extend through the cutouts in the divider onto an opposite side thereof. The board is secured in place using screws that are inserted through openings in the motherboard and threaded into the bosses on the divider. The I/O board is then mounted in the CPU on the opposite side of the divider by friction fitting the female connectors onto the male connectors of the motherboard. The I/O board is then similarly secured in place by inserting screws through openings on the board and threading the screws into the bosses on the divider. Connectors effective for connecting the motherboard and the I/O board are manufactured, for example, by Teradyne of Nashua, N.H.

The connection formed when the connectors on the motherboard and the I/O board are mated is typically very tight. A strong connection is beneficial as it ensures that the communication between the motherboard and the I/O board will not be interrupted or fail. However, the strength of this connection also makes the separation and removal of either or both of these boards very difficult. A service technician must typically exert up to approximately 80 pounds of force to extract or disengage the I/O board from the motherboard. This force typically must be exerted in a very confined area as the board connectors are typically disposed in a very confined spaced within the CPU. As a result, when a board is serviced, an attempt to remove the board by hand increases the chances of damaging the board and/or injuring the service technician. The use of a device such as a screwdriver or a pair of pliers does not facilitate the removal of the board. To the contrary, in fact, the use of such tools increases the possibility of injury to the technician and introduces further risk of damage to the I/O board due to excess flexion.

SUMMARY OF THE INVENTION

This invention addresses the disadvantages described above by providing a positive acting PC board ejector assembly for disengaging a first PC board, such as a motherboard, from a second PC board, such as an I/O board, in a chassis. The PC board ejector assembly permits removal of the board without the need for tools or equipment, and without the risk of injury to the technician or damage to the PC board. The PC board ejector assembly of the present invention also functions to reinforce the PC board to minimize the risk of damage that typically occurs during its removal from the computer.

The PC board ejector assembly includes a mounting bracket and a disengagement member coupled to the mounting bracket. The mounting bracket is positioned on at least one of the first PC board and the second PC board such that actuation of the disengagement member engages the member against the chassis to disengage the first PC board from the second PC board. The mounting bracket preferably defines an opening such that the disengagement member moves through the opening to disengage the PC boards.

The present invention further provides a method for disengaging a first PC board from a second PC board in a chassis. The method includes the steps of accessing one of the first and the second PC boards in the chassis, actuating the disengagement member of that PC board to engage the member against the chassis to disengage the PC boards from each other, and removing that PC board from the chassis.

BRIEF DESCRIPTION OF THE DRAWINGS

The above mentioned features of the invention will become more clearly understood with reference to the following detailed description as illustrated by the drawings in which:

FIG. 2 is a side elevation view of one of the PC board ejector assemblies 10 shown in FIG. 1;

FIG. 3 is a top view of the PC board ejector assembly shown in FIG. 1;

FIG. 4 is a top view of a second embodiment of the PC board ejector assembly of the present invention;

FIG. 8 is a top view of the CPU illustrated in FIG. 7, taken at 8—8, showing the PC boards interconnected about the CPU central divider; and FIG. 9 is a top view the PC boards illustrated in FIG. 8, wherein the levers of the PC board ejector assembly on one of the boards is engaged against the cabinet divider.

DETAILED DESCRIPTION OF AN ILLUSTRATIVE EMBODIMENT

Figure 1:
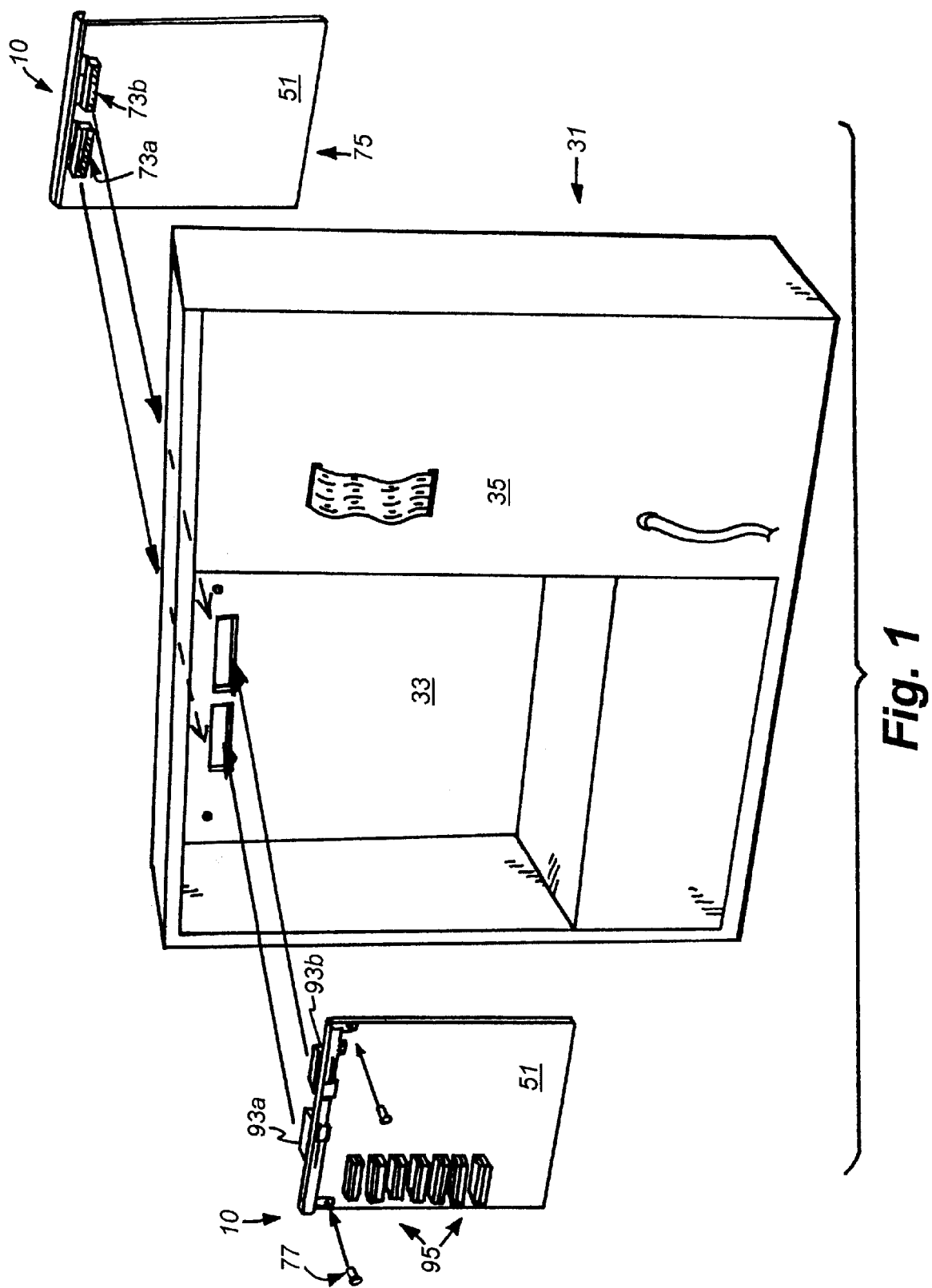
FIG. 1 is a side elevation view of a CPU including two PC boards, each including a PC board ejector assembly and connectors for interconnecting the boards in the CPU.

FIG. 1 illustrates a PC board ejector assembly 10 incorporating various features of the present invention, a computer processing unit (CPU) 31 comprising a cabinet 35 and a cabinet divider wall 33, and two printed circuit (PC) boards 51 for mounting on opposed sides of the divider wall 33. The PC board ejector assembly 10 is positioned on an end of each PC board 51 and disengages the PC board connectors 73a,b, 93a,b from one another so that one or both of the boards 51 can be easily and safely removed from the CPU 31. The PC board ejector assembly 10 also stiffens the PC board 51 to minimize the potential for warping or damage during the removal process.

FIG. 2 is a side elevation view of one embodiment of the PC board ejector assembly 10 shown in FIG. 1, including an end of the PC board 51 and a pair of PC board connectors 73*a,b*. FIG. 3 is a top view of the ejector assembly shown in FIG. 1. As best shown in FIG. 2, the PC board ejector assembly 10 includes a mounting bracket 12 which is mounted onto the PC board 51, and disengagement members 14 coupled to the mounting bracket 12.

FIG. 4 is a top view of a second embodiment of the present invention wherein disengagement members 14 move in a different manner to engage the divider wall 33 and disengage the PC board connectors 73*a,b*, 93*a,b* from each other. More particularly, the disengagement members 14 of this embodiment are oriented to move away from each other as they disengage the PC boards 51.

Figure 5:
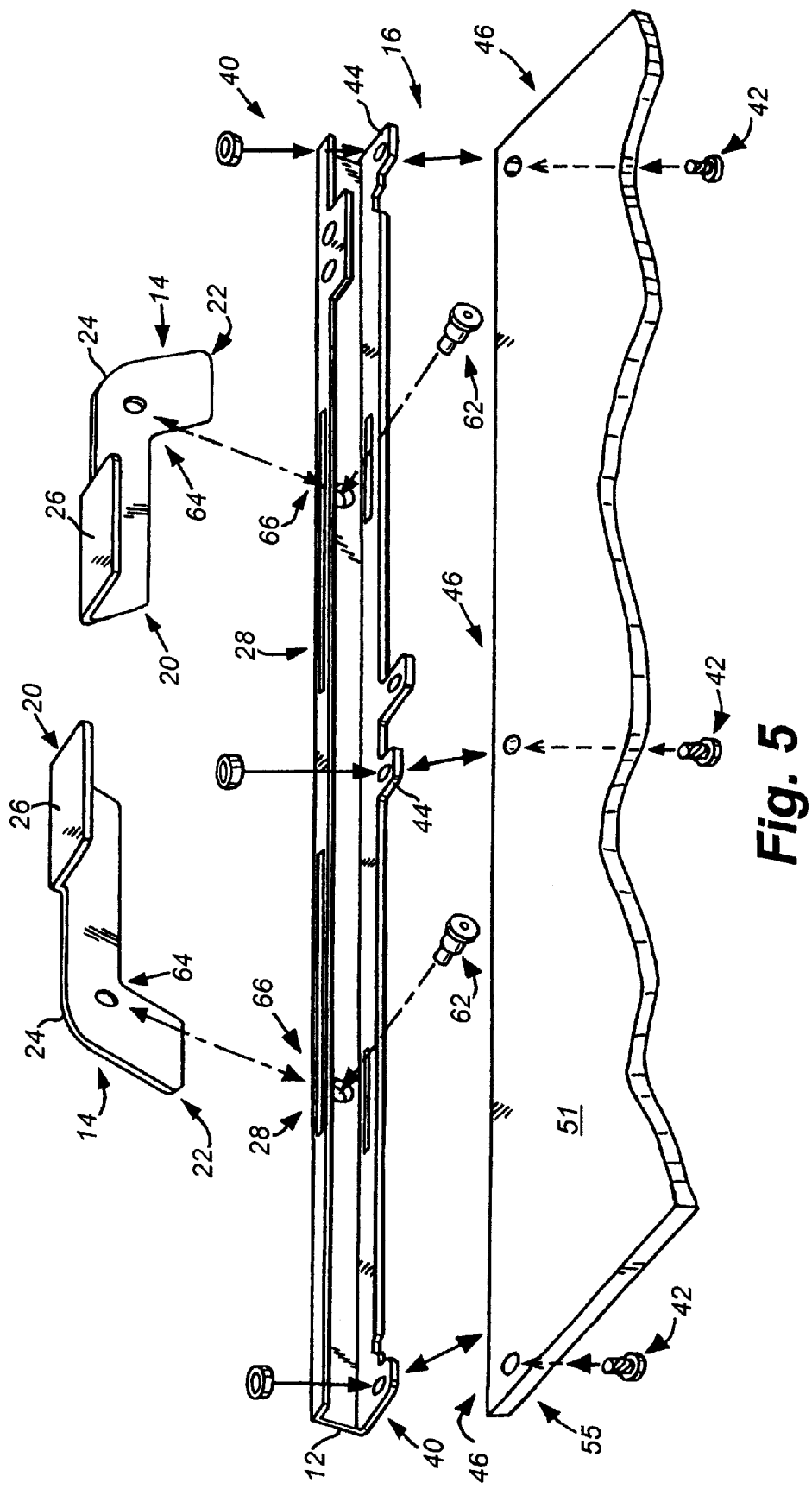
FIG. 5 is an exploded view of the PC board ejector assembly, including a cut-away portion of a PC board.
Figure 6:
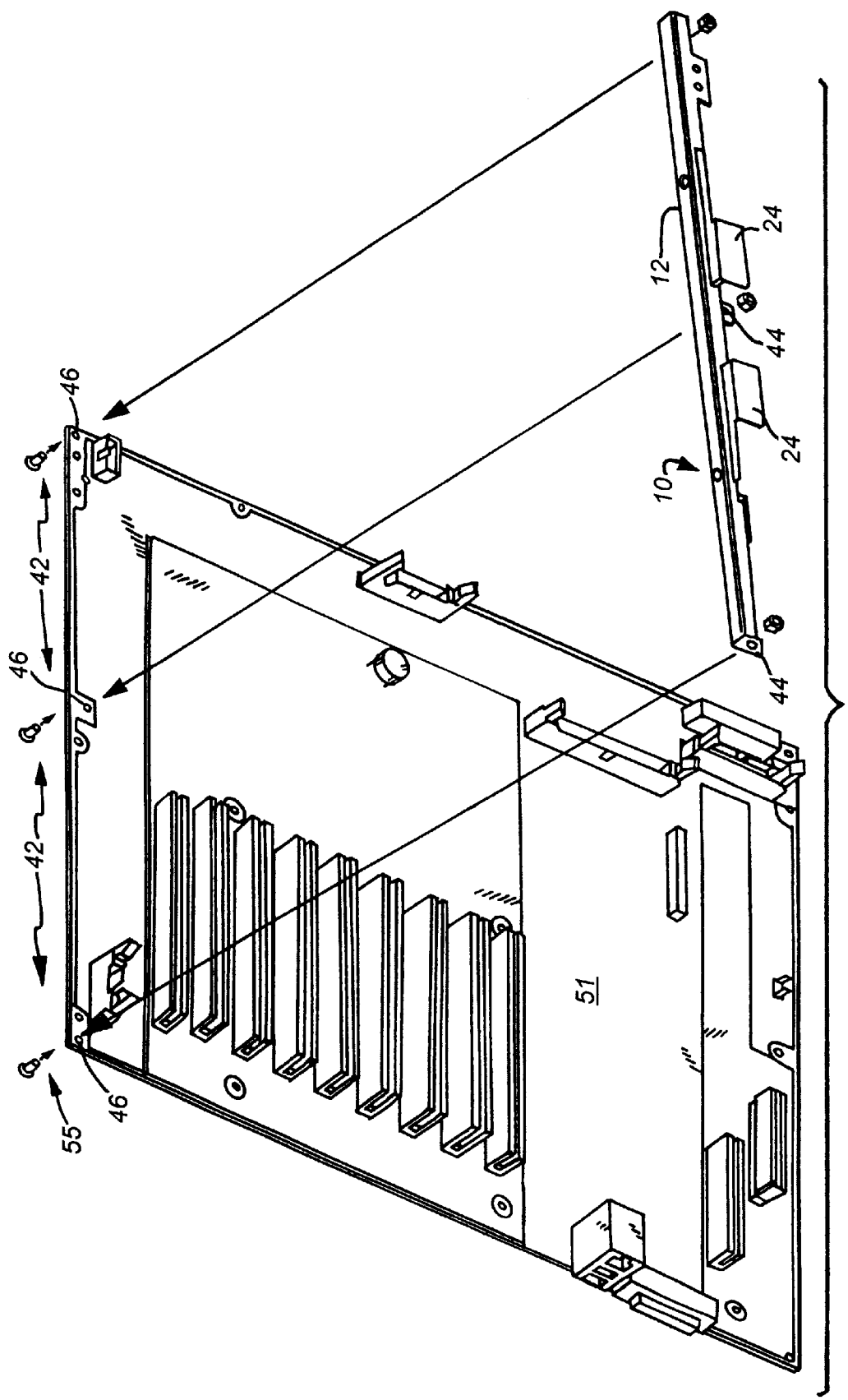
FIG. 6 is a partially exploded, side elevation view of a PC board including a PC board ejector assembly.

FIGS. 5 and 6 are exploded side elevation views of the PC board ejector assembly 10 shown in FIG. 4, and illustrate an attachment of the assembly 10 to at least a portion of a PC board 51. As will be understood from the figures, the ejector assembly 10 can be variably positioned on the PC board 51. As will also be understood from the figures, more than one PC board ejector assembly 10 can be employed on a PC board 51. In the embodiments described herein, however, one PC board ejector assembly 10 is positioned near an end 55 of the PC board 51 and proximate the connectors 73*a,b*, 93*a,b*.

The mounting bracket 12 is made of a material and is fabricated in a manner that provides optimal stiffness or rigidity qualities to the PC board ejector assembly 10 of the present invention. The stiffness or rigidity provided by the mounting bracket material enhances the overall strength of the PC board 51 and reduces the possibility that the board 51 will warp or fracture due to over-flexion during handling. A number of materials are known in the art to possess the requisite properties for the mounting bracket 12 of the present invention. Among the known materials are metals such as aluminum, steel, titanium, and certain hard plastics.

A number of methods for forming the mounting bracket 12 of the present invention in a manner that optimizes the strength of the bracket structure are also known in the art. In one embodiment, for example, the mounting bracket 12 may be formed from a multiple layers of materials positioned one upon another. In another embodiment, the bracket 12 may be formed of materials of a varied thickness to provide the greatest strength or resilience in the areas that will experience the greatest stress during insertion and removal of the PC board 51 in the CPU 31. Still other bracket materials and bracket formations will be known to those skilled in the art. In the described embodiment, the mounting bracket 12 is fabricated from steel, and the bracket 12 is configured to define a generally U-shaped channel 16, as shown in FIG. 5.

The PC ejector assembly 10 is removably or permanently mountable onto a PC board 51. The assembly 10 is removably mounted onto the board 51, for example, by configuring the mounting bracket 12 so that it is friction fit onto the board 51. The assembly 10 is also removably mounted to the board where it includes a bracket fastener 40 such as a clip to clip the assembly bracket 12 onto the board 51. As shown in FIGS. 5 and 6, a more permanent mounting may be achieved where the PC board ejector assembly 10 and the board 51 include openings 44, 46 and securement devices such as self-tapping screws or nut-and-bolt assemblies are disposed through those openings 44, 46. Bracket fasteners 40 such as rivets may also be disposed through openings 44, 46 to achieve a more permanent assembly 10 mounting. In the described embodiment, the ejector assembly 10 is secured to the PC board 51 by one or more nut-and-bolt-assemblies 42 optimally disposed in openings 44, 46 in the mounting bracket 12 and the PC board 51, respectively.

Figure 7:
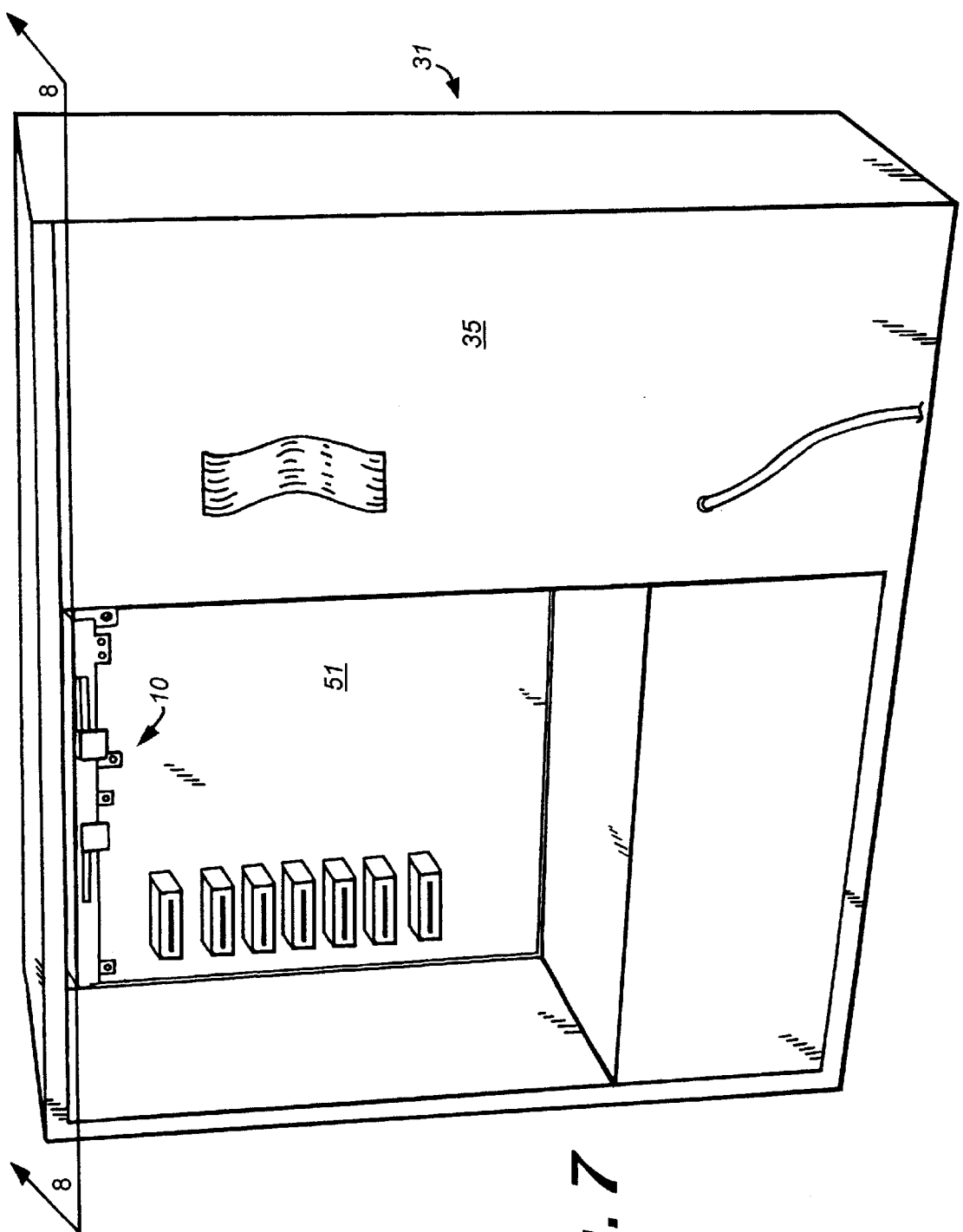
FIG. 7 is a side elevation view of a CPU shown in FIG. 1, with a PC board and PC board ejector assembly mounted in place in the CPU.

FIG. 7 is a side elevation view of the CPU 31 shown in FIG. 1, with the PC board 51 in place in the CPU 31. FIG. 8 is a top view of the CPU 31 shown in FIG. 7, wherein each PC board 51 includes the PC board ejector assembly 10 of the present invention and the disengagement members 14 of each assembly 10 are in an unengaged position. In this position, the disengagement members 14 do not disengage the PC board connectors 73*a,b*, 93*a,b* from each other. FIG. 9 illustrates the top view of the CPU 31 shown in FIG. 8, with the disengagement members 14 of one ejector assembly 10 on one PC board 51 engaged against the divider wall 33.

As illustrated in the figures, the disengagement member 14 of the present invention is coupled to the mounting bracket 12 to engage the divider wall 33 and disengage the PC board connectors 73*a,b*, 93*a,b* from each other. More particularly, in operation, the disengagement member 14 exerts a force against the divider wall 33 sufficient to overcome a frictional force that maintains board connectors 93*a,b* in connection with connectors 73*a,b* and disengage the connectors 93*a,b*, 73*a,b*. The force necessary to disengage the connectors 93*a,b*, 73*a,b* may be produced in a number of different ways. In the described embodiment, the force is generated manually, i.e., by manual actuation of the disengagement member 14.

In another embodiment, described but not shown, the disengagement member 14 is manual, but may be mechanically assisted. In this embodiment, for example, the assembly 10 includes a mechanism such as a biasing member that is disposed between the disengagement member 14 and the mounting bracket 12, and the mechanism cooperates with the disengagement member 14 to disengage and remove the board 51. That is, a force may be loaded in the biasing member when the disengagement member 14 is in the unengaged position within the mounting bracket 12, and unloaded when the disengagement member 14 is manually actuated to engage the divider wall 33. Alternatively, for example, a biasing member may be disposed about one or more of connectors 73*a,b*, 93*a,b* and between the PC board 51 and the divider wall 33 such that a force is loaded in the biasing member when the board 51 is mounted in the CPU 31 and unloaded as the disengagement member 14 engages the wall 33. Based upon this disclosure, still other methods of actuating the disengagement member 14 to disengage the connectors 73*a,b*, 93*a,b* will be recognized and known to those skilled in the art.

The disengagement member 14 of the described embodiment comprises a lever 18 that is mounted onto the mounting bracket 12. As illustrated in FIGS. 8 and 9, the lever 18 is pivotally mounted to the mounted bracket 12 and, in use, disengages the PC board 51 from the divider wall 33 by pivotal movement of a first end 20 of the lever 18. More particularly, movement of the first end 20 of the lever 18 causes a second end 22 of the lever 18 to engage the divider wall 33 and disengage the connectors 73*a*, 73*b* from the connectors 93*a*, 93*b*. Once disconnected, the board 51 may be removed from the CPU 31. As is evident from the figures, when both boards 51 are provided with the PC board ejector assembly 10 of the present invention, they are each removable by disengagement as described herein.

The lever 18 of the described embodiment may be incorporated in the present invention in any one of several ways.

As will be appreciated from the figures, the lever 18 may also have several configurations. In one embodiment, the lever 18 is a single arm lever 18 that is pivotally coupled to the mounting bracket 12 to engage the divider wall 33 of the CPU 31 and disengage connectors 93a, 93b from connectors 73a, 73b. In another embodiment, the lever 18 includes two arms that are pivotally coupled to each other at an approximate halfway point between first and second ends of each arm, such as the blade arms of a pair of scissors. In this embodiment, the arms may be coupled to the mounting bracket 12 at their pivot point. Moreover, in this embodiment, when the first ends of the levers are drawn together, the second ends of the levers are drawn toward each other to engage the divider wall 33 and disengage the connectors 73a,b, 93a,b from each other.

As shown in FIGS. 8 and 9, the disengagement member 14 of the described embodiment is a pair of levers 24 and each lever is pivotally mounted to the mounting bracket 12. Each of the levers 24 includes a tab 26 to facilitate gripping and movement, and may be moved simultaneously or sequentially. In this embodiment, the levers 24 are disposed in the mounting bracket 12 to move in opposed directions and are moved simultaneously to ensure the uniformity of the release of the connectors 73a,b, 93a,b. Movement in opposed directions, as described herein, is the movement of each of the levers 24 in a direction toward each other, as shown in FIGS. 2–3 and 8–9, or the movement of each of the levers 24 in a direction away from each other, as shown in FIG. 4. Other disengagement member configurations and gripping and movement aids will be recognized by those skilled in the art.

As discussed above, the PC ejector assembly 10 of the present invention may be positioned in any location on the PC board 51. Consequently, the overall structure of the PC board ejector assembly 10 may be varied according to its placement on the PC board 51. In one embodiment not shown, for example, the mounting bracket 12 is positioned on the end 55 of the PC board 51, and the lever 24 is mounted on a side of the mounting bracket 12 to engage the divider wall 33 without passing through mounting bracket 12. In another embodiment, also not shown, the mounting bracket 12 defines a lever opening 28 and the bracket 12 is positioned near an end 55 of PC board 51 such that the lever 24 passes through the lever opening 28 to engage the divider wall 33 without passing through the PC board 51.

In the described embodiment, as shown in FIG. 2, for example, the mounting bracket 12 and the PC board 51 cooperatively define a lever opening 28 that extends through both the mounting bracket 12 and the PC board 51. In this embodiment, when manipulated, lever 24 moves through lever opening 28 in mounting bracket 12 and the PC board 51 to engage the divider wall 33 and disengage the board 51 from the CPU 31.

The lever 24 of the present invention is removably or permanently coupled to the mounting bracket 12, as necessary. The lever 24 is removably coupled to the mounting bracket 12 where both the bracket 12 and the lever 24 are configured so that the lever 24 is slip fit or friction fit onto the bracket 12. The lever 24 is more securely but removably mounted to the mounting bracket 12 where the assembly 10 further includes a lever fastener 60, and the mounting bracket 12 and the lever 24 each define a fastener opening for securing the lever 24 to the mounting bracket 12. Fasteners adaptable for such mounting include, for example, shoulder screws and nut-and-bolt assemblies. A lever fastener 60 such as a rivet, in turn, is adaptable for use in the present invention where a more permanent mounting is necessary.

In the described embodiment, as also shown in FIG. 5, the PC board ejector assembly 10 further includes a shoulder screw 62 to pivotally couple each lever 24 to mounting bracket 12 through the lever fastener openings 64, 66.

The present invention also provides a method for ejecting a PC board 51 from a CPU 31 including the PC board ejector assembly 10 of the present invention. The method includes the steps of accessing ejector assembly 10 mounted on the PC board 51, manipulating the disengagement member 14 of the assembly 10 to engage the divider wall 33 and disengage the board 51 from the CPU 31, and removing the board 51 from the CPU 31.

The foregoing has provided a detailed description of a number of embodiments of the present invention. Various modifications and additions can be made without departing from the spirit and scope of the invention. For example, the term "bracket fastener" as used herein should be taken broadly to include a variety of different fastening devices that removably secure the mounting bracket of the present invention to the computer chassis. The term "lever fastener" as used herein, similarly, should be taken broadly to include a variety of different fastening devices that pivotally mount the lever to the mounting bracket of the present invention. The term "disengagement member" as used herein should be taken broadly to include a variety of different disengaging members that provide a separating force when engaged against the interior wall of a computer chassis. Moreover, the term "PC board" as used herein is defined broadly to include any printed circuit board that is connected to the motherboard of a computer by means of at least one connector which is frictionally fit onto at least one connector extending from the computer motherboard. The term "connector" as used herein is also defined broadly to include one or more connectors depending on the intended use of the PC board. Accordingly, this description is meant to be taken only by way of example, and not to otherwise limit the scope of this invention.

What is claimed is:

1. A printed circuit (PC) board ejector assembly for disengaging a first PC board from a second PC board in a chassis, the chassis including a surface for removably receiving the first PC board and the second PC board on opposing sides of the chassis surface and at least one connector opening cut through the chassis, the first PC board and the second PC board each including at least one connector for interconnecting the first PC board and second PC board through the connector opening in the chassis, the PC board ejector assembly comprising:
   a mounting bracket, and
   a disengagement member coupled to the mounting bracket, the mounting bracket being positioned on at least one of the first PC board and the second PC board such that actuation of the disengagement member engages the member against the chassis surface to forcibly disengage the connector of the first PC board from the connector of the second PC board through the chassis.

2. The PC board ejector assembly of claim 1, wherein the disengagement member comprises a pair of levers coupled to the mounting bracket, and movement of the levers engages the levers against the chassis surface to disengage the first PC board from the second PC board.

3. The PC board ejector assembly of claim 2, wherein the levers are coupled to the mounting bracket to move in an opposed direction with respect to each other, and movement of the levers in the opposed directions engages the levers against the chassis surface to disengage the first PC board from the second PC board.

4. The PC board ejector assembly of claim 1, wherein one of the first and the second PC boards is a motherboard and the other of the first and the second PC boards is an input/out (I/O) board.

5. The PC board ejector assembly of claim 1, wherein the disengagement member is manually actuated.

6. The PC board ejector assembly of claim 1, wherein the disengagement member is mechanically actuated.

7. The PC board ejector assembly of claim 1, further comprising at least one bracket fastener for securing the mounting bracket to at least one of the PC boards.

8. The PC board ejector assembly of claim 7, wherein the bracket fastener is selected from the group consisting at least of screws, rivets, and nuts and bolts.

9. The PC board ejector assembly of claim 1, further comprising at least one disengagement member fastener for pivotally coupling the disengagement member to the mounting bracket.

10. The PC board ejector assembly of claim 9, wherein the disengagement member fastener is selected from the group consisting at least of screws, rivets, and nuts and bolts.

11. The PC board ejector assembly of claim 1, wherein the mounting bracket further defines a disengagement member opening and movement of the disengagement member through the disengagement member opening engages the disengagement member against the chassis to to forcibly disengage the connector of the first PC board from the connector of the second PC board.

12. The PC board ejector assembly of claim 11, wherein the disengagement member is a lever coupled to the mounting bracket, and movement of the lever through the disengagement member opening engages the lever against the chassis surface to forcibly disengage the connector of the first PC board from the connector of the second PC board.

13. The PC board ejector assembly of claim 11, wherein the disengagement member comprises a pair of levers coupled to the mounting bracket, and movement of the levers through the disengagement member opening engages the levers against the chassis surface to forcibly disengage the connector of the first PC board from the connector of the second PC board.

14. The PC board ejector assembly of claim 11, wherein the levers are coupled to the mounting bracket to move in an opposed direction with respect to each other, and movement of the levers through the disengagement member opening engages the levers against the chassis surface to forcibly disengage the connector of the first PC board from the connector of the second PC board.

15. The PC board ejector assembly of claim 1, wherein the mounting bracket and at least one of the first and the second PC boards cooperate to define a disengagement member opening extending through the mounting bracket and the at least one of the first and the second PC boards, and actuation of the disengagement member engages the member against the chassis surface to forcibly disengage the connector of the first PC board from the connector of the second PC board.

16. A method of disengaging a first printed circuit (PC) board from a second PC board in a chassis using a PC board ejector assembly, the chassis including a surface for removably receiving the first PC board and the second PC board on opposing sides of the chassis surface and at least one connector opening cut through the chassis, the first PC board and the second PC board each including at least one connector for inter-connecting the first PC board and the second PC board through the connector opening in the chassis, the method comprising at least the steps of:

accessing one of the first PC board and the second PC board, at least one of the first PC board and the second PC board including a PC board ejector assembly, the PC board ejector assembly comprising a mounting bracket and a disengagement member coupled to the mounting bracket, the mounting bracket being positioned on the PC board such that actuation of the disengagement member engages the member against the chassis surface to disengage one of the first PC board and the second PC board from the other of the first PC board and the second PC board, manipulating the disengagement member to engage the chassis surface and to forcibly disengage the connector of one of the first PC board and the second PC board from the connector of the other of the first PC board and the second PC board, and removing at least one of the first PC board and the second PC board from the chassis.

17. The method of claim 16, wherein one of the first PC board and the second PC board is a motherboard and the other of the first PC board and the second PC board is an input/output (I/O) board.

18. A printed circuit (PC) board ejector assembly for disengaging a first PC board from a second PC board in a chassis, the chassis including a surface for removably receiving the first PC board and the second PC board on opposing sides of the chassis surface and at least one connector opening cut through the chassis, the first PC board and the second PC board each including at least one connector for interconnecting the first PC board and the second PC board through the connector opening in the chassis, the PC ejector assembly comprising:

means for mounting the PC board ejector assembly to at least one of the first PC board and the second PC board, and means for disengaging at least one of the first PC board and the second PC board from the other of the first PC board and the second PC board, the disengaging means being coupled to the mounting means such that actuation of the disengagement means engages the disengagement means against the chassis surface to forcibly disengage the connector of at least one of the first PC board and the second PC board from the connector of the other of the first PC board and the second PC board.

19. The PC board ejector assembly as set forth in claim 18 wherein the mounting means comprises a mounting bracket and the disengagement means comprises a pair of levers coupled to the mounting bracket, and movement of the levers engages the levers against the chassis surface to disengage at least one of the first PC board and the second PC boardfrom the other of the first PC board and the second PC board.

20. A printed circuit (PC) board ejector assembly for disengaging a motherboard from an input/output (I/O) board in a chassis, the chassis including a surface for removably receiving the motherboard and the I/O board on opposing sides of the chassis surface and at least one connector opening cut through the chassis, the motherboard and the I/O board each including at least one connector for interconnecting the motherboard and the I/O board through the connector opening in the chassis, the PC board ejector assembly comprising:

a mounting bracket, and a disengagement member coupled to the mounting bracket, the mounting bracket being positioned on at least one of the motherboard and the I/O board such that actuation of the disengagement member engages the member against the chassis surface to forcibly disengage the connector of the motherboard from the connector of the I/O board through the chassis.

* * * * *